United States Patent
Kim et al.

(10) Patent No.: US 10,636,991 B2
(45) Date of Patent: Apr. 28, 2020

(54) ORGANIC LIGHT-EMITTING DIODE, ORGANIC LIGHT-EMITTING DISPLAY INCLUDING THE SAME, AND METHOD OF MANUFACTURING THE SAME

(71) Applicant: LG Display Co., Ltd., Seoul (KR)

(72) Inventors: Sangbeom Kim, Paju-si (KR); Jeongdae Seo, Incheon (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/217,601

(22) Filed: Dec. 12, 2018

(65) Prior Publication Data
US 2019/0198790 A1    Jun. 27, 2019

(30) Foreign Application Priority Data
Dec. 22, 2017    (KR) .................. 10-2017-0178316

(51) Int. Cl.
*H01L 51/00* (2006.01)
*H01L 51/50* (2006.01)
(Continued)

(52) U.S. Cl.
CPC ........ *H01L 51/5004* (2013.01); *H01L 27/322* (2013.01); *H01L 27/3244* (2013.01);
(Continued)

(58) Field of Classification Search
None
See application file for complete search history.

(56) References Cited

U.S. PATENT DOCUMENTS 9,406,908 B2    8/2016    Kim et al.
2006/0227079 A1    10/2006    Kashiwabara
(Continued)

FOREIGN PATENT DOCUMENTS

KR    10-2006-0071399 A    6/2006
KR    10-2011-0114569 A    10/2011
(Continued)

OTHER PUBLICATIONS

Notice of Allowance dated Jun. 25, 2019, issued in corresponding Korean Patent Application No. 10-2017-0178316.

*Primary Examiner* — Reema Patel
(74) *Attorney, Agent, or Firm* — Morgan, Lewis & Bockius LLP

(57) ABSTRACT

An organic light-emitting diode includes: a first electrode, a light-emitting stack thereon including: a hole transport layer (HTL), a blue light-emitting layer including: a blue host material (BHM), and a blue fluorescent dopant (BFD) material, and an electron transport layer (ETL), and a second electrode on the light-emitting stack, wherein BFD LUMO>BHM, BFD HOMO>BHM, BFD singlet energy<BHM, HTL HOMO>BHM and BFD, HTL HOMO–BFD HOMO≤0.1 eV, the HTL material LUMO>the BHM, HTL LUMO–BHM LUMO≥0.5 eV, HTL LUMO>BFD, ETL LUMO>BHM and BFD, a difference in LUMO between the ETL material and the BFD material≤0.1 eV, and the HTL material, the ETL material, and the BHM have the following triplet energy relationships: $T_{1,BH}<T_{1,HTL}$ and $T_{1,BH}<T_{1,ETL}$, $2.8<T_{1,HTL}<3.0$, and $2.6<T_{1,ETL}<2.8$.

22 Claims, 7 Drawing Sheets

(51) Int. Cl.
*H01L 27/32* (2006.01)
*H01L 51/56* (2006.01)
*H01L 51/52* (2006.01)

(52) U.S. Cl.
CPC ...... *H01L 51/5012* (2013.01); *H01L 51/5016* (2013.01); *H01L 51/5056* (2013.01); *H01L 51/5072* (2013.01); *H01L 51/5278* (2013.01); *H01L 51/56* (2013.01); *H01L 51/005* (2013.01); *H01L 51/0054* (2013.01); *H01L 51/0056* (2013.01); *H01L 51/0058* (2013.01); *H01L 51/0072* (2013.01); *H01L 51/0074* (2013.01); *H01L 2251/552* (2013.01)

(56) References Cited

U.S. PATENT DOCUMENTS

2011/0227058 A1  9/2011  Masui et al.
2012/0168735 A1  7/2012  Pflumm et al.

FOREIGN PATENT DOCUMENTS

KR  10-2012-0080606 A  7/2012
KR  10-2015-0002249 A  1/2015
KR  10-2015-0078333 A  7/2015

ORGANIC LIGHT-EMITTING DIODE, ORGANIC LIGHT-EMITTING DISPLAY INCLUDING THE SAME, AND METHOD OF MANUFACTURING THE SAME

CROSS-REFERENCE TO RELATED APPLICATION(S)

This application claims the benefit of and priority to Korean Patent Application No. 10-2017-0178316, filed on Dec. 22, 2017, the entirety of which is hereby incorporated by reference.

BACKGROUND

1. Technical Field

The present disclosure relates to an organic light-emitting diode, an organic light-emitting display including the same, and a method of manufacturing the same.

2. Discussion of the Related Art

Recently, there is increasing interest in flat-panel display elements occupying a small space, with increasing size of displays. A technology of an organic light-emitting display including organic light-emitting diodes (OLEDs) as the flat-panel display elements has been rapidly developed in the art.

An organic light-emitting diode emits light through conversion of energy of excitons created by pairs of electrons and holes generated upon injection of charges into an organic light-emitting layer formed between an anode and a cathode. As compared with exiting display techniques, the organic light-emitting diode has various advantages, such as low voltage operation, low power consumption, good color reproduction, and various applications through application of a flexible substrate.

Generally, OLEDs can be classified into a single OLED and a tandem OLED. The tandem OLED is an OLED including two or more light-emitting stacks and allows easier improvement in operation voltage and efficiency than an existing single OLED.

In a typical white organic light-emitting diode (WOLED), a difference in energy level between functional layers constituting a blue light-emitting layer deteriorates efficiency in injection of electrons or holes at an interface between the functional layers, thereby having a negative influence on performance and lifespan of the WOLED.

SUMMARY

Accordingly, embodiments of the present disclosure are directed to an organic light-emitting diode, an organic light-emitting display including the same, and a method of manufacturing the same that substantially obviate one or more of the issues due to limitations and disadvantages of the related art.

An aspect of the present disclosure is to provide an organic light-emitting diode capable of reducing operation voltage while improving luminous efficacy and lifespan thereof, and an organic light-emitting display including the same.

An aspect of the present disclosure is to provide an organic light-emitting diode that may include a blue light-emitting layer while securing improved operation characteristics and long lifespan.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an organic light-emitting diode, including: a first electrode, a light-emitting stack on the first electrode including, sequentially stacked on the first electrode: a hole transport layer including a hole transport layer material, a blue light-emitting layer including: a blue host material, and a blue fluorescent dopant material, and an electron transport layer including an electron transport layer material, and a second electrode on the light-emitting stack, wherein the blue fluorescent dopant material has a higher LUMO (Lowest Unoccupied Molecular Orbital) energy level than the blue host material, wherein the blue fluorescent dopant material has a higher HOMO (Highest Occupied Molecular Orbital) energy level than the blue host material, wherein the blue fluorescent dopant material has a lower singlet energy than the blue host material, wherein the hole transport layer material has a higher HOMO energy level than the blue host material, wherein the hole transport layer material has a higher HOMO energy level than the blue fluorescent dopant material, wherein a difference in HOMO energy level between the hole transport layer material and the blue fluorescent dopant material is 0.1 eV or less, wherein the hole transport layer material has a higher LUMO energy level than the blue host material, wherein a difference in LUMO energy level between the hole transport layer material and the blue host material is 0.5 eV or more, wherein the hole transport layer material has a higher LUMO energy level than the blue fluorescent dopant material, wherein the electron transport layer material has a higher LUMO energy level than the blue host material, wherein the electron transport layer material has a higher LUMO energy level than the blue fluorescent dopant material, wherein a difference in LUMO energy level between the electron transport layer material and the blue fluorescent dopant material is 0.1 eV or less, and wherein the hole transport layer material, the electron transport layer material, and the blue host material have the following triplet energy relationships: $T_{1,BH} < T_{1,HTL}$ and $T_{1,BH} < T_{1,ETL}$, $2.8 < T_{1,HTL} < 3.0$, and $2.6 < T_{1,ETL} < 2.8$, where $T_{1,HTL}$, $T_{1,ETL}$ and $T_{1,BH}$ indicate triplet energies of the hole transport layer material, the electron transport layer material, and the blue host material, respectively.

In another aspect, there is provided a method of manufacturing an organic light-emitting diode, the method including: providing a first electrode, providing a light-emitting stack on the first electrode including, sequentially stacking on the first electrode: a hole transport layer including a hole transport layer material, a blue light-emitting layer including: a blue host material, and a blue fluorescent dopant material, and an electron transport layer including an electron transport layer material, and providing a second electrode on the light-emitting stack, wherein the blue fluorescent dopant material has a higher LUMO (Lowest Unoccupied Molecular Orbital) energy level than the blue host material, wherein the blue fluorescent dopant material has a higher HOMO (Highest Occupied Molecular Orbital) energy level than the blue host material, wherein the blue fluorescent dopant material has a lower singlet energy than the blue host material, wherein the hole transport layer material has a higher HOMO energy level than the blue host material, wherein the hole transport layer material has a higher HOMO energy level than the blue fluorescent dopant material, wherein a difference in HOMO energy level between the hole transport layer material and the blue fluorescent dopant material is 0.1 eV or less, wherein the hole transport layer material has a higher LUMO energy level than the blue host material, wherein a difference in LUMO energy level between the hole transport layer material and the blue host material is 0.5 eV or more, wherein the hole transport layer material has a higher LUMO energy level than the blue fluorescent dopant material, wherein the electron transport layer material has a higher LUMO energy level than the blue host material, wherein the electron transport layer material has a higher LUMO energy level than the blue fluorescent dopant material, wherein a difference in LUMO energy level between the electron transport layer material and the blue fluorescent dopant material is 0.1 eV or less, and wherein the hole transport layer material, the electron transport layer material, and the blue host material have the following triplet energy relationships: $T_{1,BH} < T_{1,HTL}$ and $T_{1,BH} < T_{1,ETL}$, $2.8 < T_{1,HTL} < 3.0$, and $2.6 < T_{1,ETL} < 2.8$, where $T_{1,HTL}$, $T_{1,ETL}$ and $T_{1,BH}$ indicate triplet energies of the hole transport layer material, the electron transport layer material, and the blue host material, respectively.

Other systems, methods, features and advantages will be, or will become, apparent to one with skill in the art upon examination of the following drawings and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, that may be included to provide a further understanding of the disclosure and are incorporated in and constitute a part of this specification, illustrate embodiments of the disclosure and together with the description serve to explain various principles of the disclosure.

Figure 1:
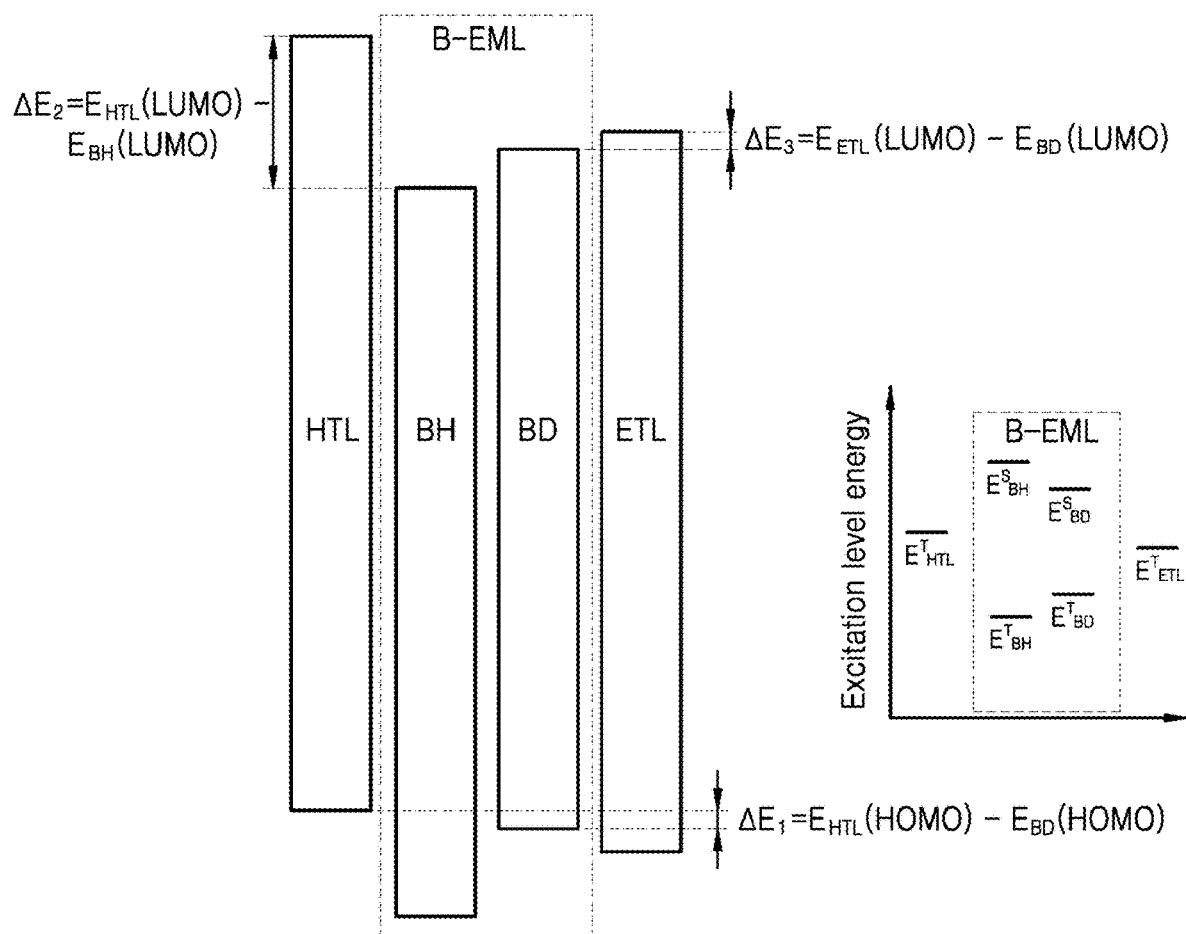
FIG. 1 is an energy diagram depicting energy levels of a hole transport layer (HTL), a blue light-emitting layer (B-EML), and an electron transport layer (ETL) of an organic light-emitting diode according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof may be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing embodiments of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range. In describing a position relationship, when a position relation between two parts is described as, for example, "on," "over," "under," or "next," one or more other parts may be disposed between the two parts unless a more limiting term, such as "just" or "direct(ly)," is used.

In describing a time relationship, when the temporal order is described as, for example, "after," "subsequent," "next," or "before," a case which is not continuous may be included unless a more limiting term, such as "just," "immediate(ly)," or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms like "first," "second," "A," "B," "(a)," and "(b)" may be used. These terms are merely for differentiating one element from another element, and the essence, sequence, order, or number of a corresponding element should not be limited by the terms. Also, when an element or layer is described as being "connected," "coupled," or "adhered" to another element or layer, the element or layer can not only be directly connected or adhered to that other element or layer, but also be indirectly connected or adhered to the other element or layer with one or more intervening elements or layers "disposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

In accordance with one aspect of the present disclosure, there may be provided an organic light-emitting diode including: a first electrode, a light-emitting stack on the first electrode, and a second electrode on the light-emitting stack. The light-emitting stack may include a hole transport layer, a blue light-emitting layer, and an electron transport layer. The hole transport layer, the blue light-emitting layer, and the electron transport layer may be sequentially stacked on the first electrode.

The blue light-emitting layer may include a blue host material and a blue fluorescent dopant material. The hole transport layer may include a hole transport layer material. The electron transport layer may include an electron transport layer material.

The light-emitting stack may satisfy the following energy level conditions (A) to (G):

(A) The blue fluorescent dopant material has a higher LUMO energy level than the blue host material;

(B) the blue fluorescent dopant material has a higher HOMO energy level than the blue host material;

(C) the blue fluorescent dopant material has a lower singlet energy than the blue host material;

(D) the hole transport layer material has a higher HOMO energy level than the blue host material;

(E) the hole transport layer material has a higher HOMO energy level than the blue fluorescent dopant material and a difference in HOMO energy level between the hole transport layer material and the blue fluorescent dopant material is 0.1 eV or less;

(F) the hole transport layer material has a higher LUMO energy level than the blue host material and a difference in LUMO energy level between the hole transport layer material and the blue host material is 0.5 eV or more.

(G) The hole transport layer material has a higher LUMO energy level than the blue fluorescent dopant material;

(H) the electron transport layer material has a higher LUMO energy level than the blue host material;

(I) the electron transport layer material has a higher LUMO energy level than the blue fluorescent dopant material and a difference in LUMO energy level between the electron transport layer material and the blue fluorescent dopant material is 0.1 eV or less; and (J) the hole transport layer material, the electron transport layer material, and the blue host material have the following triplet energy relationships: $T_{1,BH} < T_{1,HTL}$ and $T_{1,BH} < T_{1,ETL}$, $2.8 < T_{1,HTL} < 3.0$, and $2.6 < T_{1,ETL} < 2.8$, where $T_{1,HTL}$, $T_{1,ETL}$ and $T_{1,BH}$ and T1,BH indicate triplet energies of the hole transport layer material, the electron transport layer material, and the blue host material, respectively.

The organic light-emitting diode, including the light-emitting stack satisfying the energy level conditions of the blue fluorescent dopant material and the blue host material, may facilitate injection and recombination of electrons and holes in the blue light-emitting layer. Excitons can be generated only within the light-emitting layer, thereby improving operation characteristics and lifespan thereof.

Further, in the organic light-emitting diode, including the hole transport layer satisfying the HOMO energy level condition of the hole transport layer material, holes may be injected into the light-emitting layer through the hole transport layer at an anode, and the blue fluorescent dopant material forming the light-emitting layer may exhibit strong hole characteristics. In this case, a small difference in HOMO energy level may be set between the blue fluorescent dopant material exhibiting the hole characteristics and the hole transport layer, thereby improving hole injection from the hole transport layer into the light-emitting layer. With this structure, the organic light-emitting diode can achieve improvement in operation characteristics and long lifespan.

In the organic light-emitting diode, which may include the light-emitting stack including the blue light-emitting layer and the hole transport layer satisfying the LUMO energy level conditions of the blue host material, the blue fluorescent dopant material, and the hole transport layer material, distribution of electrons may be restricted in the blue light-emitting layer, thereby enabling efficient control of generation of excitons. In addition, the organic light-emitting diode may prevent excitons generated in the blue light-emitting layer from migrating into the hole transport layer, thereby preventing addition reaction and energy loss due to the excitons. As a result, the organic light-emitting diode may prevent variation in charge migration characteristics due to impurities generated by addition reaction, which can be generated by excitons having migrated to the hole transport layer, and may maintain operation characteristics thereof. Further, in the organic light-emitting diode, a site where exciton energy is used may be restricted in the blue light-emitting layer, thereby improving luminous efficacy. With this structure, the organic light-emitting diode can achieve improvement in operation characteristics and long lifespan.

In the organic light-emitting diode, in which the blue host material, the blue fluorescent dopant material and the electron transport layer satisfying the LUMO energy level conditions may be interposed between the second electrode and the blue light-emitting layer, electrons transported from the second electrode may be effectively injected into the blue light-emitting layer, thereby enabling efficient control of generation of excitons. With this structure, the organic light-emitting diode can achieve improvement in operation characteristics and long lifespan.

In the blue light-emitting layer, excitons having singlet energy and excitons having triplet energy may be generated in a ratio of 1:3. The triplet energy excitons have longer lifespans than the singlet energy excitons. The triplet energy excitons can migrate into the hole transport layer and the electron transport layer around the blue light-emitting layer, and may react with component materials in the corresponding functional layers. As a result, by-products may be generated in the corresponding functional layers, and may change the composition of the corresponding functional layers. The by-products may break a balance between electrons and holes in the light-emitting diode by changing migration and injection characteristics of charges, which may move through each of the functional layers. As a result, operation characteristics of the light-emitting diode may be changed and deteriorated, thereby causing decrease in the lifespan thereof. The hole transport layer and the electron transport layer having the triplet energy ranges defined in Condition (J) may reduce or prevent additional reaction in each of the functional layers by restricting migration of the triplet energy excitons generated in the blue light-emitting layer. With this structure, the organic light-emitting diode can reduce or prevent deterioration in characteristics, while achieving a long lifespan.

FIG. 1 is an energy diagram depicting energy levels of a hole transport layer (HTL), a blue light-emitting layer (B-EML) and an electron transport layer (ETL) of an organic light-emitting diode according to an example embodiment of the present disclosure.

In FIG. 1, the blue light-emitting layer (B-EML) may include a blue fluorescent dopant material (BD) and a blue host material (BH). With reference to the example of FIG. 1, the energy level of each layer in the organic light-emitting diode satisfies Conditions (A) to (J). For example, as shown in FIG. 1, (A) the blue fluorescent dopant material (BD) has a higher LUMO energy level than the blue host material (BH). In addition, as shown in FIG. 1, (B) the blue fluorescent dopant material (BD) has a higher HOMO energy level than the blue host material (BH). In FIG. 1, (C) the blue fluorescent dopant material (BD) has a lower singlet energy than the blue host material (BH). In FIG. 1, (D) the hole transport layer (HTL) material has a higher HOMO energy level than the blue host material (BH). In FIG. 1, $\Delta E_1$ is caused by Condition (E) wherein the hole transport layer (HTL) material has a higher HOMO energy level than the blue fluorescent dopant material (BD). A difference in HOMO energy level between the hole transport layer material and the blue fluorescent dopant material is 0.1 eV or less. For example, $\Delta E_1 \leq 0.1$ eV. In FIG. 1, $\Delta E_2$ is caused by Condition (F) wherein the hole transport layer (HTL) material has a higher LUMO energy level than the blue host material (BH). A difference in LUMO energy level between the hole transport layer (HTL) material and the blue host material (BH) is 0.5 eV or more. For example, $\Delta E_2 \geq 0.5$ eV. In FIG. 1, (G) the hole transport layer (HTL) material has a higher LUMO energy level than the blue fluorescent dopant material (BD). In FIG. 1, (H) the electron transport layer (ETL) material has a higher LUMO energy level than the blue host material (BH). In FIG. 1, $\Delta E_3$ is caused by Condition (I) wherein the electron transport layer (ETL) material has a higher LUMO energy level than the blue fluorescent dopant material (BD). A difference in LUMO energy level between the electron transport layer (ETL) material and the blue fluorescent dopant material (BD) is 0.1 eV or less. For example, $\Delta E_3 \leq 0.1$ eV. In FIG. 1, (J) the hole transport layer material, the electron transport layer material, and the blue host material have the following triplet energy relationship: $T_{1,BH} < T_{1,HTL}$ and $T_{1,BH} < T_{1,ETL}$, and the triplet energy of each of the hole transport layer material and the electron transport layer material is within the following range: $2.8 < T_{1,HTL} < 3.0$ and $2.6 < T_{1,ETL} < 2.8$.

Figure 2:
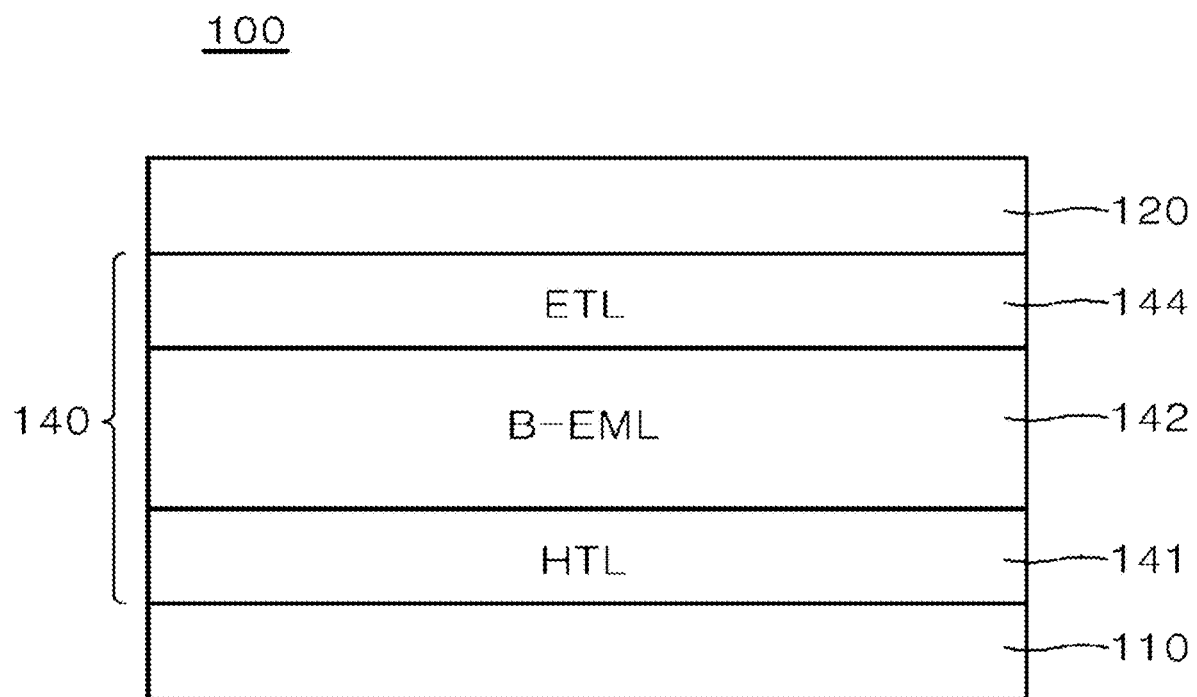
FIG. 2 is a sectional view of an organic light-emitting diode according to one example embodiment of the present disclosure.

FIG. 2 is a sectional view of an organic light-emitting diode according to one example embodiment of the present disclosure.

FIG. 2 is a sectional view of an organic light-emitting diode 100 according to one example embodiment of the present disclosure, which may include a first electrode 110, a light-emitting stack 140, and a second electrode 120. The light-emitting stack 140 may include a hole transport layer (HTL) 141, a blue light-emitting layer (B-EML) 142 adjoining the hole transport layer (HTL) 141, and an electron transport layer (ETL) 144 adjoining the blue light-emitting layer (B-EML) 142.

The first electrode 110 may be an anode through which holes may be injected into the organic light-emitting diode, and may be formed of a conductive material having a high work function. For example, the first electrode 110 may include one or more of: indium tin oxide (ITO), indium zinc oxide (IZO), and/or zinc oxide (ZnO). Embodiments are not limited to these examples.

The second electrode 120 may be a cathode through which electrons may be injected into the organic light-emitting diode, and may be formed of a conductive material having a low work function. For example, the second electrode 120 may include one or more of: aluminum (Al), magnesium (Mg), and/or an aluminum-magnesium alloy (AlMg). Embodiments are not limited to these examples.

The light-emitting stack 140 may include the hole transport layer (HTL) 141, the blue light-emitting layer (BML) 142, and the electron transport layer (ETL) 144 interposed between the first electrode 110 and the second electrode 120. The hole transport layer (HTL) 141 may be interposed between the first electrode 110 and the blue light-emitting layer (B-EML) 142.

The hole transport layer (HTL) 141 may include one or more of: N,N'-diphenyl-N,N'-bis(3-methylphenyl)-1,1'-biphenyl-4,4'-diamine (TPD), NPD, MTDATA, 1,3-bis(N-carbazolyl)benzene (mCP), CuPC, TCTA, tris(trifluorovinylether)-tris(4-carbazolyl-9-yl-phenyl)amine (TFV-TCTA), tris[4-(diethylamino)phenyl]amine, N-(biphenyl-4-yl)-9,9-dimethyl-N-(4-(9-phenyl-9H-carbazol-3-yl)phenyl)-9H-fluorene-2-amine, tri-p-tolylamine, N-[1,1'-biphenyl]-4-yl-9,9-dimethyl-N-[4-(9-phenyl-9H-carbazol-3-yl)phenyl]-amine, 4,4'-bis(N-carbazolyl)-1,1'-biphenyl (CBP), 1,1-bis(4-(N,N'-di(p-tolyl)amino)phenyl)cyclohexane (TAPC), and/or combinations thereof. Embodiments are not limited to these examples.

In one embodiment, the hole transport layer (HTL) material may be a tertiary amine compound. The blue light-emitting layer (B-EML) 142 may include a blue host material (BH) and a blue fluorescent dopant material (BD). In one embodiment, the blue host material (BH) may include an anthracene-based material. For example, the blue host material (BH) may include one or more of: 9,10-di-(2-naphtyl)anthracene (ADN), 2-tert-butyl-9,10-di(2-naphthyl)anthracene, 2-methyl-9,10-di(2-naphtyl)anthracene (MADN), and/or combinations thereof. Embodiments are not limited to these examples.

In one embodiment, the blue fluorescent dopant material (BD) may include a pyrene amine derivative material. For example, the blue fluorescent dopant material (BD) may include one or more of: 1,6-bis(diphenylamine)pyrene, TBPe(tetrakis(t-butyl)perylene), and/or combinations thereof, without being limited thereto.

The blue light-emitting layer (B-EML) 142 may include 1% by weight (wt %) to 5 wt % of the blue fluorescent dopant material (BD). Within this content of the blue fluorescent dopant material (BD), the blue light-emitting layer (B-EML) 142 can effectively satisfy the energy level conditions described above. If the content of the blue fluorescent dopant material (BD) exceeds this range, concentration extinction can occur between dopant materials, thereby causing deterioration in efficiency at high brightness. If the content of the blue fluorescent dopant material (BD) is less than this range, energy transfer from a host to a dopant becomes difficult, thereby making it difficult to obtain a desired level of luminous characteristics while causing reduction in lifespan of the organic light-emitting diode due to side reaction in the light-emitting layer.

The electron transport layer (HTL) may be between the blue light-emitting layer (B-EML) 142 and the second electrode 120 and serves to secure efficient transport of electrons. For example, the electron transport layer (HTL) material may include derivatives, such as oxadiazole, triazole, phenanthroline, benzoxazole, benzothiazole, benzimidazole, triazine, and the like. Embodiments are not limited to these examples.

For example, the electron transport layer (HTL) 144 may include an electron transport material including one or more of: Alq3, 2-biphenyl-4-yl-5-(4-tbutylphenyl)-1,3,4-oxadiazole (PBD), spiro-PBD, lithium quinolate (Liq), 2-[4-(9,10-Di-2-naphthalenyl-2-anthracenyl)phenyl]-1-phenyl-1H-benzimidazol, 3-(biphenyl-4-yl)-5-(4-tertbutylphenyl)-4-phenyl-4H-1,2,4-triazole (TAZ), 4,7-diphenyl-1,10-phenanthroline (Bphen), tris(phenylquinoxaline) (TPQ), 1,3,5-tri[(3-pyridyl)-phen-3-yl]benzene (TmPyPB), 1,3,5-tris(N-phenylbenzimiazole-2-yl)benzene (TPBI), and/or combinations thereof. Embodiments are not limited to these examples. For example, the electron transport layer (HTL) material may be a pyrimidine-based material.

Optionally, the electron transport layer (HTL) 144 may be formed by doping with an alkali metal or alkali earth metal compound. Examples of metal components that can be used as a dopant for the electron transport layer (HTL) 144 may include alkali metals, such as lithium (Li), sodium (Na), potassium (K) and cesium (Cs); and alkali earth metals, such as magnesium (Mg), strontium (Sr), barium (Ba), and radium (Ra), without being limited thereto. The alkali metal or alkali earth metal compound may be present in an amount of about 1 wt % to 20 wt %, without being limited thereto.

The light-emitting stack 140 may optionally further include a hole injection layer (HIL) and an electron transport layer (ETL), as desired. The hole injection layer (HIL) may be between the first electrode 120 and the hole transport layer (HTL) 142. The hole injection layer (HIL) may improve interface characteristics between the first electrode 120 formed of an inorganic material and the hole transport layer (HTL) 142 formed of an inorganic material.

For example, the hole injection layer (HIL) may include one or more of: 4,4',4''-tris(3-methylphenylphenylamino)triphenylamine (MTDATA), copper phthalocyanine (CuPc), tris(4-carbazolyl-9-yl-phenyl)amine (TCTA), N,N'-diphenyl-N,N'-bis(1-naphthyl)-1,1'-biphenyl-4,4''-diamine (NPB, NPD), 1,4,5,8,9,11-hexaazatriphenylenehexacarbonitrile (HATCN), 1,3,5-tris[4-(diphenylamino)phenyl]benzene (TDAPB), poly(3,4-ethylenedioxythiophene)polystyrene sulfonate (PEDOT/PSS), 2,3,5,6-tetrafluoro-7,7,8,8-tetracyanoquinodimethane (F4-TCNQ), N-(biphenyl-4-yl)-9,9-dimethyl-N-(4-(9-phenyl-9H-carbazol-3-yl)phenyl)-9H-fluoren-2-amine, and combinations thereof. Embodiments are not limited to these examples.

The electron injection layer (EIL) may be between the electron transport layer (ETL) and the second electrode 120 and serves to secure efficient injection of electrons. For example, the electron injection layer (EIL) may include at least one selected from the group consisting of alkali halides, such as LiF, NaF, KF, RbF, CsF, FrF, $BeF_2$, $MgF_2$, $CaF_2$, $SrF_2$, $BaF_2$ and $RaF_2$, organic materials, such as Liq (lithium quinolate), lithium benzoate, sodium stearate, Alq3, BAlq, PBD, spiro-PBD, and TAZ, and combinations thereof.

Figure 3:
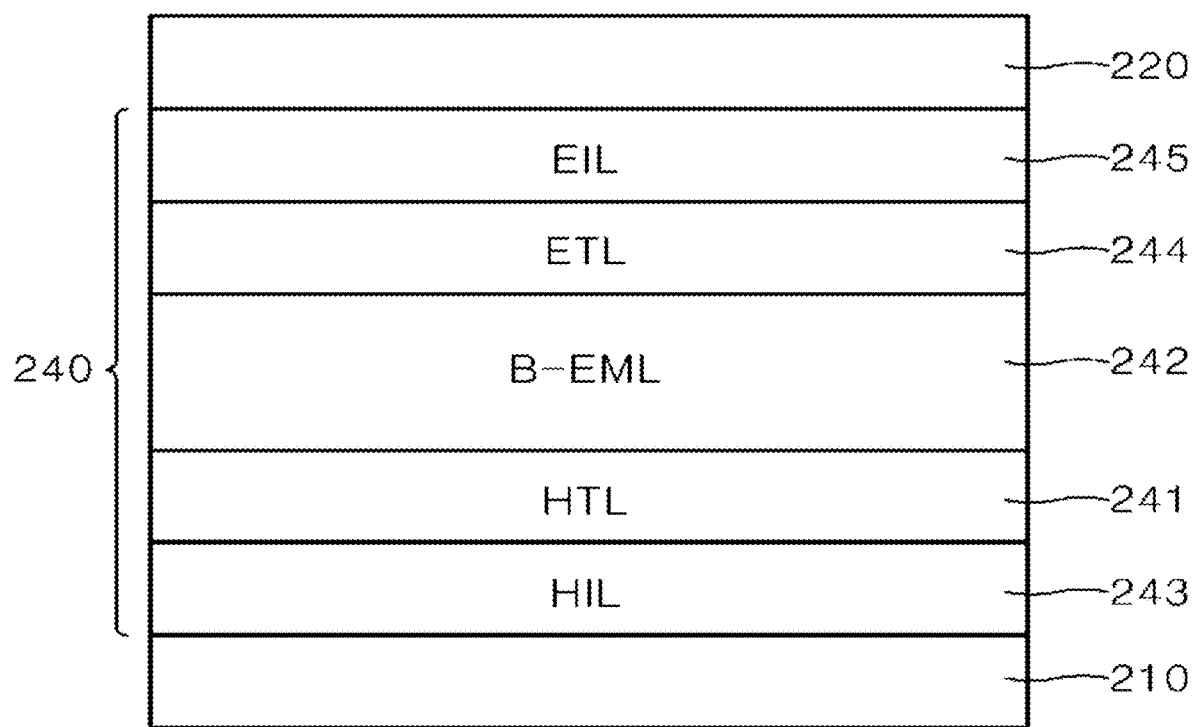
FIG. 3 is a sectional view of an organic light-emitting diode according to another example embodiment of the present disclosure.

FIG. 3 is a sectional view of an organic light-emitting diode according to another example embodiment of the present disclosure.

In FIG. 3, an organic light-emitting diode 200 according to another example embodiment of the present disclosure may include a first electrode 210, a light-emitting stack 240 and a second electrode 220. With reference to FIG. 3, the light-emitting stack 240 may include a hole injection layer (HIL) 243, a hole transport layer (HTL) 241, a blue light-emitting layer (B-EML) 242, an electron transport layer (ETL) 244, and an electron injection layer (EIL) 245. Details of the layers stacked in the organic light-emitting diode 200 according to this embodiment are substantially similar to those of the above embodiment, and detailed description thereof will be omitted.

The organic light-emitting diode may have a tandem structure including at least two light-emitting stacks. In one embodiment, each of the light-emitting stacks 142, 242 may be a first light-emitting stack, and the organic light-emitting diode may further include at least one additional light-emitting stack including a second light-emitting stack between the first electrode and the second electrode.

Figure 4:
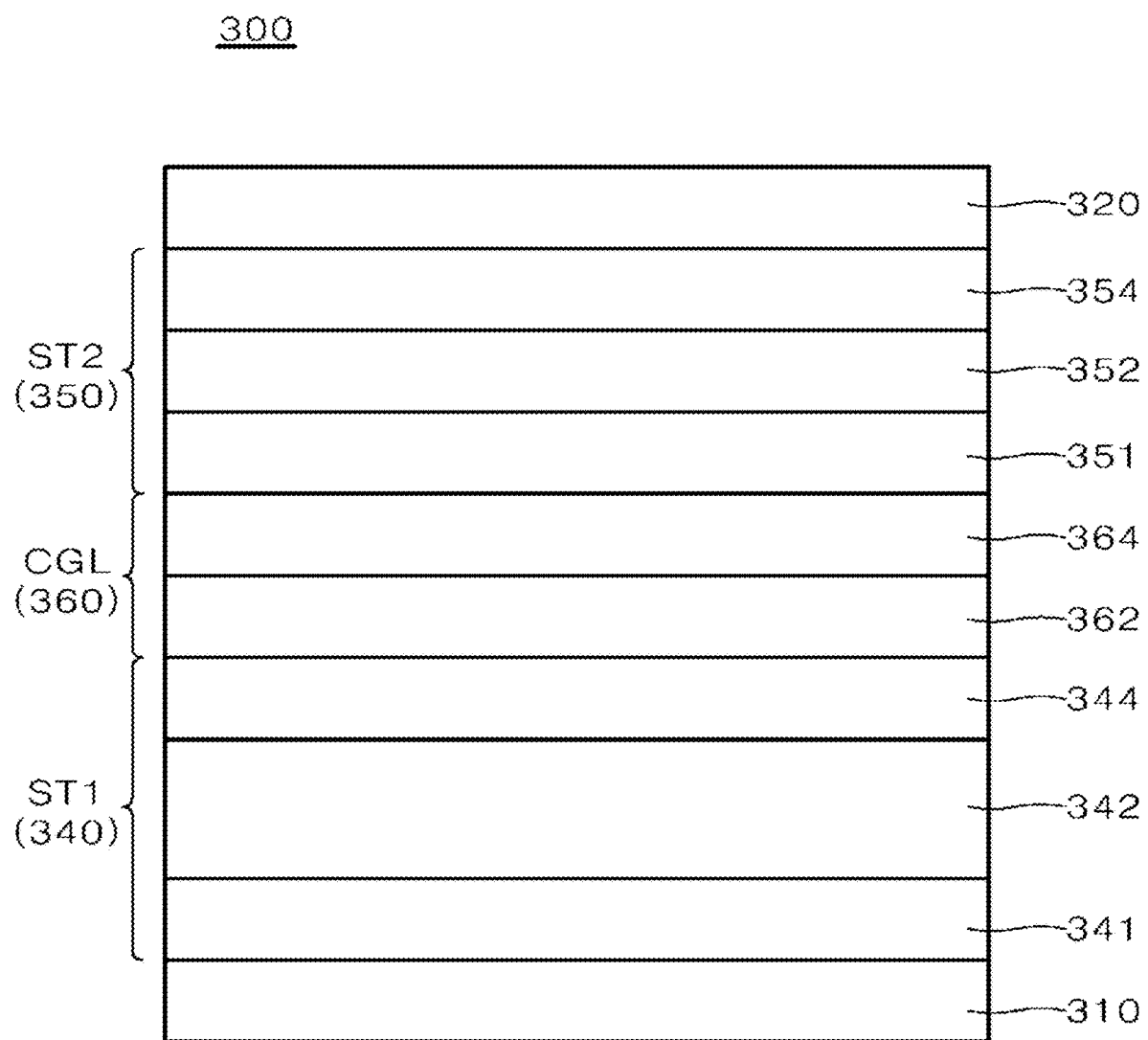
FIG. 4 is a sectional view of an organic light-emitting diode according to a further example embodiment of the present disclosure.

FIG. 4 is a sectional view of an organic light-emitting diode according to a further example embodiment of the present disclosure.

In FIG. 4, an organic light-emitting diode 300 according to a further example embodiment of the present disclosure may include a first electrode 310, a first light-emitting stack (ST1) 340, a charge generation layer (CGL) 360, a second light-emitting stack (ST2) 350, and a second electrode 320. With reference to FIG. 4, the first light-emitting stack (ST1) 340 may include a first hole transport layer (HTL) 341, a first blue light-emitting layer 342, and a first electron transport layer (ETL) 344. The second light-emitting stack (ST2) 350 may include a second hole transport layer (HTL) 351, a second blue light-emitting layer 352, and a second electron transport layer (ETL) 354. In addition, each of the first light-emitting stack (ST1) 340 and the second light-emitting stack (ST2) 350 may further include an organic layer, such as a hole injection layer, a hole transport layer, an electron transport layer, and an electron injection layer, as desired. Details of the layers stacked in the organic light-emitting diode 300 according to this embodiment are substantially similar to those of the above embodiment, and detailed description thereof will be omitted.

In the organic light-emitting diode 300, the charge generation layer (CGL) 360 may be between the first light-emitting stack (ST1) 340 and the second light-emitting stack (ST2) 350, e.g., to improve current efficiency in each of the light-emitting layers while securing efficient distribution of charges. For example, the charge generation layer 360 may be between first light-emitting stack (ST1) 340 and the second light-emitting stack (ST2) 350. The first light-emitting stack (ST1) 340 may be connected to the second light-emitting stack (ST2) 350 by the charge generation layer 360. The charge generation layer 360 may be a PN junction charge generation layer in which an N-type charge generation layer 362 may adjoin a P-type charge generation layer 364.

The N-type charge generation layer 362 may face the first light-emitting stack (ST1) 340, and the P-type charge generation layer 364 may face the second light-emitting stack (ST2) 350. The charge generation layer 360 may generate charges or may divide the charges into holes and electrons to supply the holes and electrons to the first and second light-emitting stacks 340 and 350.

For example, the N-type charge generation layer 362 may supply electrons to the first light-emitting stack (ST1) 340 adjacent to the first electrode 310. The P-type charge generation layer 364 may supply holes to the second light-emitting stack (ST2) 350, and the second hole transport layer 351 may supply holes to the second light-emitting stack (ST2) 350 adjacent to the second electrode 320.

The N-type charge generation layer 362 may be formed to constitute a host-dopant system, and thus may include an N-type dopant material and an N-type host material. The N-type dopant material may include Group I and II metals on the periodic table, organic materials capable of supplying electrons, or a mixture thereof. For example, the N-type dopant material may include one of an alkali metal and an alkali earth metal. For example, the N-type charge generation layer 362 may be an organic layer formed by doping with an alkali metal, such as lithium (Li), sodium (Na), potassium (K), and cesium (Cs); or an alkali earth metal, such as magnesium (Mg), strontium (Sr), barium (Ba), and radium (Ra), without being limited thereto. The N-type host material may include at least one material capable of supplying electrons and may include one or more of, for example: tris(8-hydroxyquinolino)aluminum (Alq3), 8-hydroxyquinolinolato-lithium (Liq), 2-(4-biphenylyl)-5-(4-tert-butylphenyl)-1,3,4-oxadiazole (PBD), 3-(4-biphenyl)4-phenyl-5-tert-butylphenyl-1,2,4-triazole (TAZ), Spiro-PBD, bis(2-methyl-8-quinolinolate)-4-(phenylphenolato)aluminum (BAlq), SAlq, 2,2',2-(1,3,5-benzinetriyl)-tris(1-phenyl-1-H-benzimidazole (TPBi), oxadiazole, triazole, phenanthroline, benzoxazole, and benzthiazole, without being limited thereto.

Alternatively, the N-type charge generation layer 362 may not constitute the host-dopant system. For example, the N-type charge generation layer 362 may be free from the N-type dopant material. The P-type charge generation layer 364 may include a P-type dopant material and a P-type host material. The P-type charge generation layer 364 may be on the N-type charge generation layer 362 to form a PN junction together with the N-type charge generation layer 362. The P-type dopant material may include a metal oxide, an organic material, such as tetrafluoro-tetracyanoquinodimethane (F4-TCNQ), hexaazatriphenylenehexacarbonitrile (HAT-CN), hexaazatriphenylene, and the like; or may include a metallic material, such as $V_2O_5$, $MoO_x$, and $WO_3$, without being limited thereto. The P-type host material may include at least one material capable of transferring holes selected from the group consisting of, for example, N,N-dinaphthyl-N,N'-diphenyl benzidine (N,N'-bis(naphthalene-1-yl)-N,N'-bis(phenyl)-2,2'-dimethyl benzidine, NPD), N,N'-bis-(3-methylphenyl)-N,N'-bis-(phenyl)-benzidine (TPD), and 4,4',4-tris(N-3-methylphenyl-N-phenyl-amino)-triphenylamine (MTDATA), without being limited thereto.

The additional light-emitting stack may emit red (R), green (G), or yellow (Y) light. In one embodiment, the first light-emitting stack (ST1) 340 may emit blue light and the second light-emitting stack (ST2) 350 may emit green (G), yellow green (YG), yellow (Y), or orange light, which has a longer wavelength than the blue light.

In one embodiment, the organic light-emitting diode may be a white organic light-emitting diode which has luminous characteristics of red (R), green (G), and blue (B) colors, which are the three primary colors of light. For example, in the white organic light-emitting diode, the first light-emitting stack (ST1) 340 may emit blue light, and the second light-emitting stack (ST2) 350 may include one host material and a yellow dopant to emit yellow (Y) light, such that the white organic light-emitting diode may emit blue and yellow light, thereby realizing white light. In operation of the white organic light-emitting diode, white light can be realized through mixture of light emitted from the first light-emitting stack (ST1) 340 and light emitted from the second light-emitting stack (ST2) 350. The organic light-emitting diode may be used, for example, in an organic light-emitting display and a lighting apparatus.

In accordance with another aspect of the present disclosure, there may be provided an organic light-emitting display. The organic light-emitting display may include a substrate, an organic light-emitting diode disposed above the substrate, and a driving device between the substrate and the organic light-emitting diode and connected to the first electrode.

Figure 5:
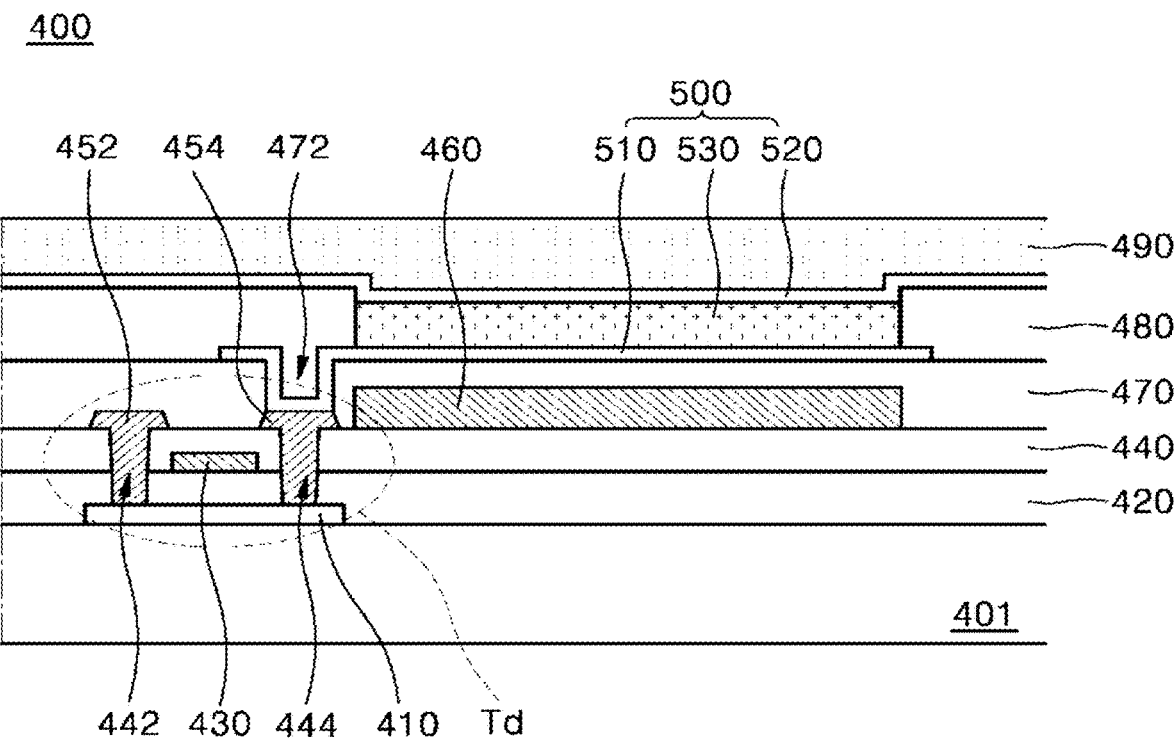
FIG. 5 is a sectional view of an organic light-emitting display according to one example embodiment of the present disclosure.

FIG. 5 is a sectional view of an organic light-emitting display according to one example embodiment of the present disclosure.

With reference to FIG. 5, an organic light-emitting display 400 according to one example embodiment may include a substrate 401, an organic light-emitting diode 500, and an encapsulation layer 490 covering the organic light-emitting diode 500. A thin film transistor Td, acting as a driving device, and the organic light-emitting diode 500, connected to the thin film transistor Td, may be on the substrate 401.

Although not shown in the drawings, the organic light-emitting display may further include a gate line and a data line intersecting each other to define a pixel region, a power line extending parallel to one of the gate line and the data line and separated therefrom, a switching thin film transistor connected to the gate line and the data line, and a storage capacitor connected to the power line and one electrode of the switching thin film transistor on the substrate 401.

The thin film transistor Td may be connected to the switching thin film transistor, and may include a semiconductor layer 410, a gate electrode 430, a source electrode 452 and a drain electrode 454. The semiconductor layer 410 may be on the substrate 401, and may include an oxide semiconductor material or polycrystalline silicon. When the semiconductor layer 410 includes the oxide semiconductor material, a light shielding pattern (not shown) may be provided under the semiconductor layer 410 to reduce or prevent degradation of the semiconductor layer 401 due to light by blocking light from entering the semiconductor layer 410. Alternatively, the semiconductor layer 410 may include polycrystalline silicon. In this alternative embodiment, both edges of the semiconductor layer 410 may be doped with impurities.

A gate insulation layer 420 including an insulating material may be formed over the substrate 401 to be disposed on the semiconductor layer 410. The gate insulation layer 420 may be formed of an inorganic insulating material, such as silicon oxide or silicon nitride.

The gate electrode 430 may include a conductive material, such as a metal, and may be at a location on the gate insulation layer 420 corresponding to the center of the semiconductor layer 410. The gate electrode 430 may be connected to the switching thin film transistor.

An interlayer insulation layer 440 may include an insulating material over the substrate 401 to be on the gate electrode 430. The interlayer insulation layer 440 may include an inorganic insulation material, such as silicon oxide or silicon nitride, or an organic insulation material, such as benzocyclobutene or photo-acryl.

The interlayer insulation layer 440 may include first and second semiconductor layer contact holes 442, 444, which may respectively expose opposite sides of the semiconductor layer 410. The first and second semiconductor layer contact holes 442, 444 may be at opposite sides of the gate electrode 430 to be separated therefrom.

A source electrode 452 and a drain electrode 454 including a conductive material may be on the interlayer insulation layer 440. The source electrode 452 and the drain electrode 454 may be separated from each other around the gate electrode 430, and may respectively contact the opposite sides of the semiconductor layer 410 through the first and second semiconductor layer contact holes 442, 444. The source electrode 452 may be connected to the power line (not shown).

The semiconductor layer 410, the gate electrode 430, the source electrode 452, and the drain electrode 454 may constitute the thin film transistor Td. In this example embodiment, the thin film transistor Td has a coplanar structure wherein the gate electrode 430, the source electrode 452 and the drain electrode 454 may be on the semiconductor layer 410.

Alternatively, the thin film transistor Td may have an inverted staggered structure in which the gate electrode may be at a lower side of a semiconductor layer, and the source electrode and the drain electrode may be at an upper side of the semiconductor layer. In this structure, the semiconductor layer may include non-crystalline silicon. On the other hand, the switching thin film transistor (not shown) may have a substantially similar structure as the thin film transistor Td.

The organic light-emitting display 400 may include a color filter 460 that may absorb or pass light emitted from the organic light-emitting diode 500. For example, the color filter 460 can absorb or pass red (R), green (G), blue (B), and/or white (W) light. In this case, each of the color filter patterns adapted to absorb or pass red, green, and blue light may be separately formed in the corresponding pixel region to overlap an organic light-emitting layer 530 of the organic light-emitting diode 500, which may emit light in a wavelength band to be absorbed or passed by the corresponding color filter pattern. With the color filter 460, the organic light-emitting display 400 can realize full-color display.

For example, when the organic light-emitting display 400 is a bottom-emission type, the color filter 460 for absorbing light may be on the interlayer insulation layer 440 that corresponds to the organic light-emitting diode 500. In an alternative embodiment, in which the organic light-emitting display 400 is a top-emission type, the color filter may be on the organic light-emitting diode 500, for example, on the second electrode 520. By way of example, the color filter 460 may have a thickness of about 2 µm to 5 µm. In this example embodiment, the organic light-emitting diode 500 may be a white light-emitting diode having a tandem structure, as shown in FIG. 4.

A protective layer 470 may cover the thin film transistor Td. The protective layer 470 may include a drain contact hole 472 that may expose the drain electrode 454.

A first electrode 510 may be on the protective layer 470 to be separately disposed in each pixel region, and may be connected to the drain electrode 454 of the thin film transistor Td through the drain contact hole 472. The first electrode 510 may be an anode, and may include a conductive material having a relatively high work function. For example, the first electrode 510 may be formed of a transparent conductive material, such as ITO, IZO, or ZnO.

On the other hand, when the organic light-emitting display 400 is a top-emission type, a reflective electrode or a reflective layer may be further provided on a lower surface of the first electrode 510. For example, the reflective electrode or the reflective layer may include one or more of: aluminum (Al), silver (Ag), nickel (Ni), and/or an aluminum-palladium-copper (APC) alloy. Embodiments are not limited to these examples.

A bank layer 486 may be provided on the protective layer 470 to cover an edge of the first electrode 510. The bank layer 480 may expose a central region of the first electrode 510 corresponding to the pixel region.

A light-emitting stack 530 may be on the first electrode 510. By way of example, the light-emitting stack 530 may include at least two light-emitting stacks, as shown in FIG. 4, to form a tandem structure of the organic light-emitting diode 500.

A second electrode 520 may be on the light-emitting stack 530, and may be above the substrate 401. The second electrode 520 may be over a display region, and may include a conductive material having a relatively low work function to be used as a cathode. For example, the second electrode 520 may include one or more of: aluminum (Al), magnesium (Mg), and/or an AlMg alloy. Embodiments are not limited to these examples.

The first electrode 510, the light-emitting stack 530, and the second electrode 520 may constitute the organic light-emitting diode 500. An encapsulation layer 490 may be provided on the second electrode 520 to reduce or prevent external moisture from entering the organic light-emitting diode 500. Although not shown in the drawings, the encapsulation layer 490 may have a trilayer structure in which a first inorganic layer, an organic layer, and a second inorganic layer may be sequentially stacked, without being limited thereto.

Next, an example embodiment of the present disclosure will be described in more detail with reference to examples. However, it should be noted that these examples are provided for illustration only and should not be construed in any way as limiting the disclosure.

EXPERIMENTAL RESULTS

Example 1

In a vacuum chamber at a pressure of $5 \times 10^{-8}$ to $7 \times 10^{-8}$ torr, an organic light-emitting diode was fabricated by sequentially depositing a hole injection layer, a hole transport layer (HTL1), a blue light-emitting layer (blue host material (BH) and blue fluorescent dopant material (BD, 4 wt % doping)), an electron transport layer (ETL1), an electron injection layer (LiF) and a cathode on an ITO substrate (anode).

Figure 6:
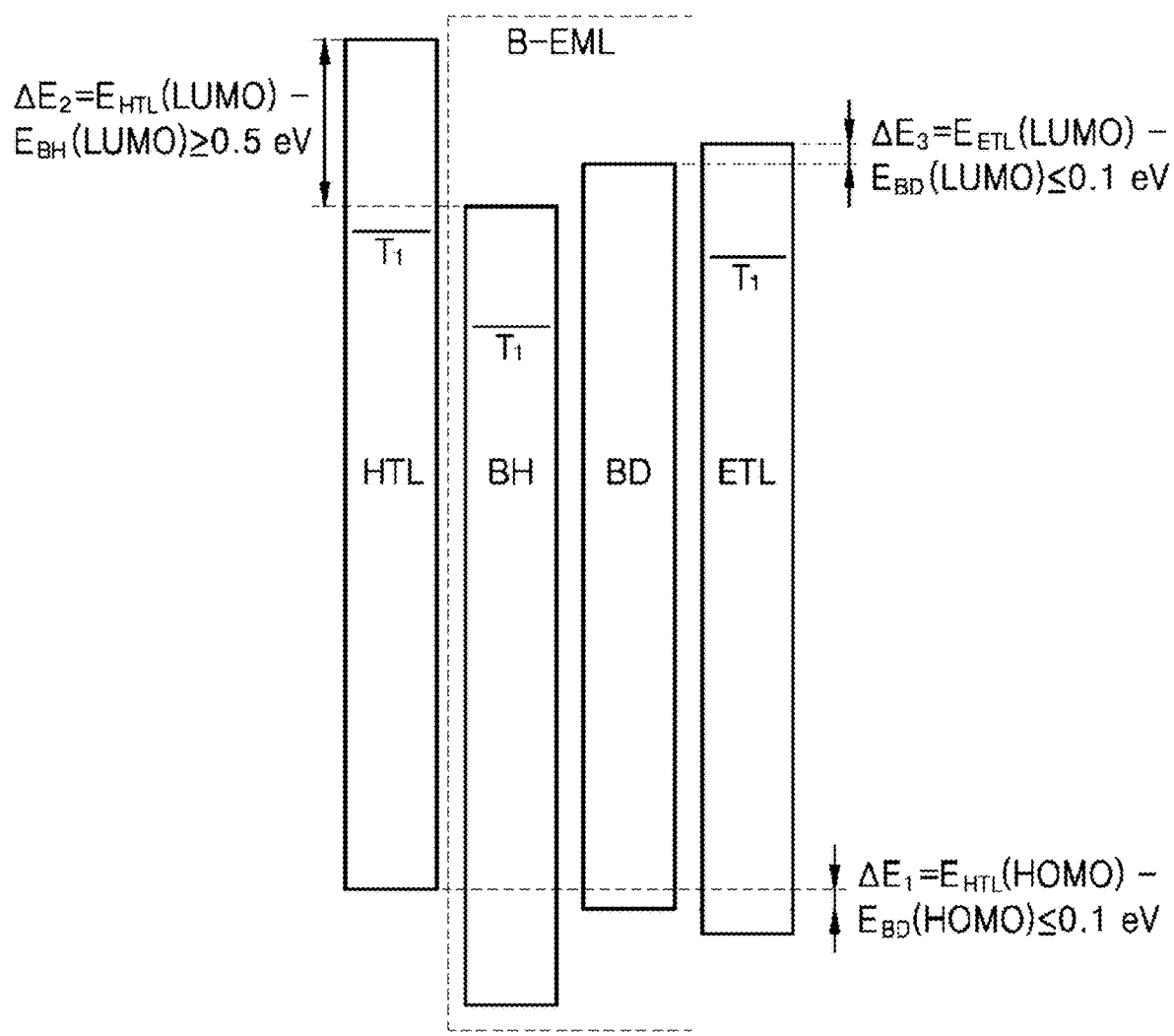
FIG. 6 is an energy diagram depicting energy levels of an organic light-emitting diode of Example 1.

FIG. 6 is an energy diagram depicting energy levels of an organic light-emitting diode of Example 1.

FIG. 6 is an energy diagram depicting the energy levels of HTL1/BH+BD/ETL1 of the fabricated organic light-emitting diode. In evaluation of the energy level, it could be seen that, in the fabricated organic light-emitting diode, the difference between the HOMO energy level of HTL1 and the HOMO energy level of BD was 0.1 eV or less; the difference between the LUMO energy level of HTL1 and the LUMO energy level of BH was 0.5 eV or more; and the difference between the LUMO energy level of ETL1 and the LUMO energy level of BD was 0.1 eV or less. With reference to FIG. 6, the difference between the HOMO energy level of HTL1 and the HOMO energy level of BD is 0.1 eV or less; the difference between the LUMO energy level of HTL1 and the LUMO energy level of BH is 0.5 eV or more; and the difference between the LUMO energy level of ETL1 and the LUMO energy level of BD is 0.1 eV or less, as indicated by dotted lines.

Comparative Example 1

In a vacuum chamber at a pressure of $5 \times 10^{-8}$ to $7 \times 10^{-8}$ torr, an organic light-emitting diode was fabricated by sequentially depositing a hole injection layer, a hole transport layer (HTL2), a blue light-emitting layer (blue host material (BH) and blue fluorescent dopant material (BD, 4 wt % doping)), an electron transport layer (ETL2), an electron injection layer (LiF) and a cathode on an ITO substrate (anode).

Figure 7:
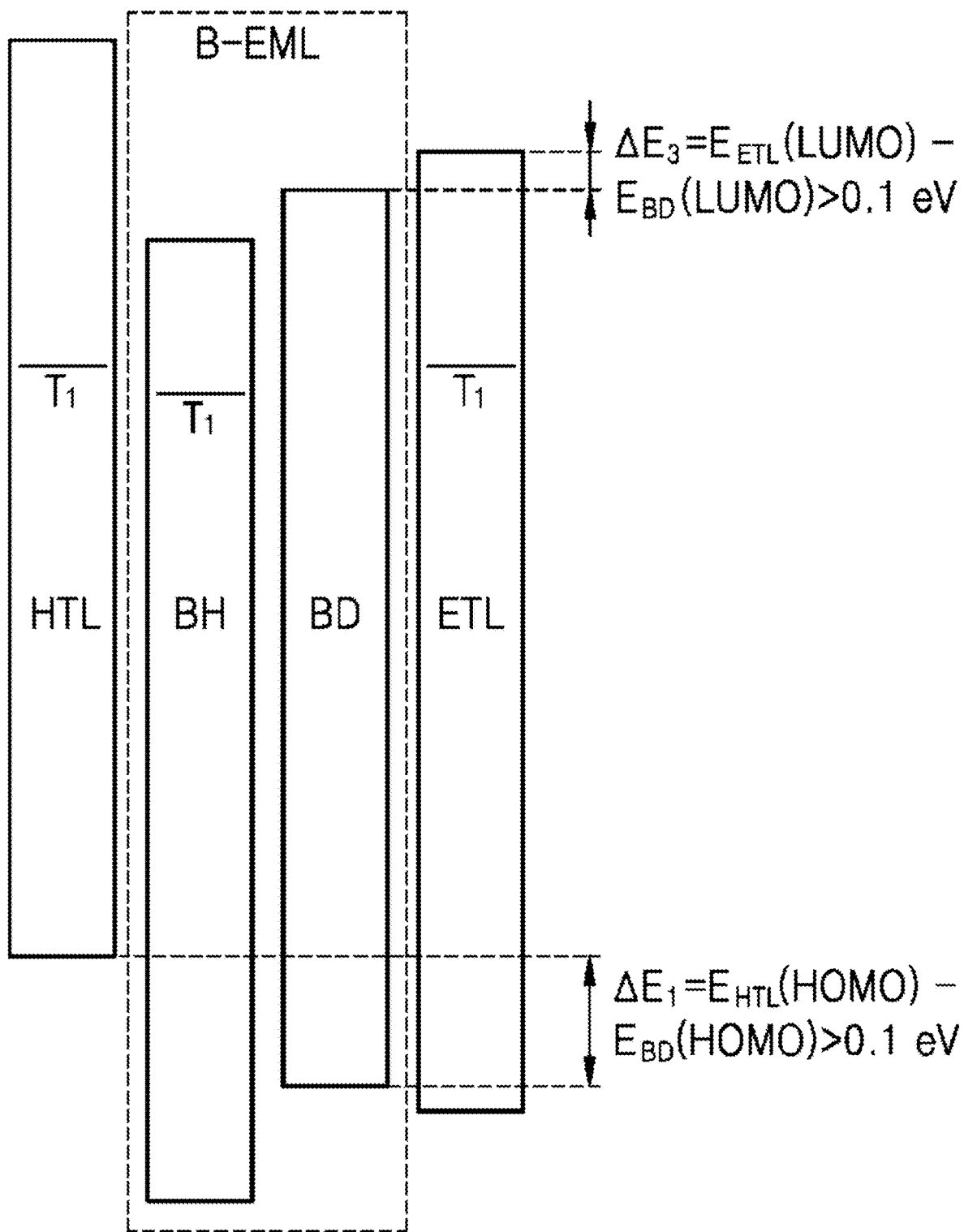
FIG. 7 is an energy diagram depicting energy levels of an organic light-emitting diode of Comparative Example 1.

FIG. 7 is an energy diagram depicting energy levels of an organic light-emitting diode of Comparative Example 1.

FIG. 7 is an energy diagram depicting the energy levels of HTL2/BH+BD/ETL2 of the fabricated organic light-emitting diode of Comparative Example 1. In evaluation of the energy level, it could be seen that, in the fabricated organic light-emitting diode, the difference between the HOMO energy level of HTL2 and the HOMO energy level of BD was greater than 0.1 eV and the difference between the LUMO energy level of ETL2 and the LUMO energy level of BD was greater than 0.1 eV. With reference to FIG. 7, the difference between the HOMO energy level of HTL2 and the HOMO energy level of BD is greater than 0.1 eV and the difference between the LUMO energy level of ETL2 and the LUMO energy level of BD is greater than 0.1 eV, as indicated by dotted lines.

Materials used in Example 1 and Comparative Example 1 and energy levels thereof are shown as follows:

| Name | Structure | HOMO (eV) | LUMO (eV) | $T_1$ (eV) |
| --- | --- | --- | --- | --- |
| HTL1 | 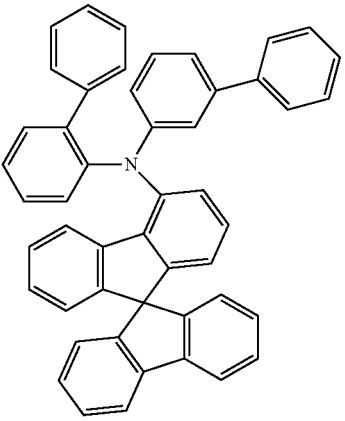 [SMILES: c1ccc(-c2cccc(N(c3ccccc3-c3ccccc3)c3cccc4c3-c3ccccc3C43c4ccccc4-c4ccccc43)c2)cc1] | −5.79 | −2.57 | 2.82 |
| HTL2 | 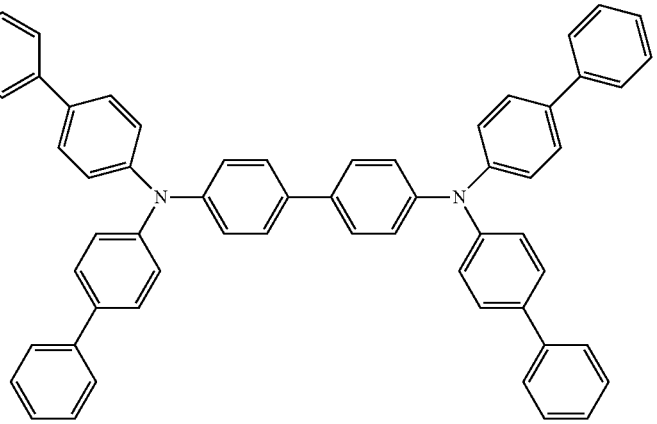 | −5.50 | −2.42 | 2.52 |

-continued
| Name | Structure | HOMO (eV) | LUMO (eV) | T₁ (eV) |
|------|-----------|-----------|-----------|---------|
| ETL1 | 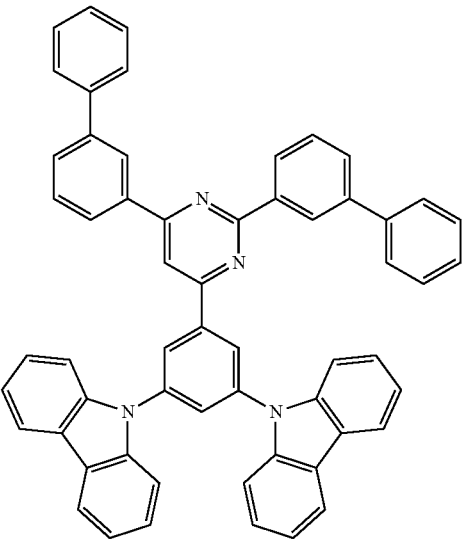 [SMILES: c1ccc(-c2cccc(-c3cc(-c4cc(-n5c6ccccc6c6ccccc65)cc(-n5c6ccccc6c6ccccc65)c4)nc(-c4cccc(-c5ccccc5)c4)n3)c2)cc1] | −6.21 | −2.73 | 2.67 |
| ETL2 | 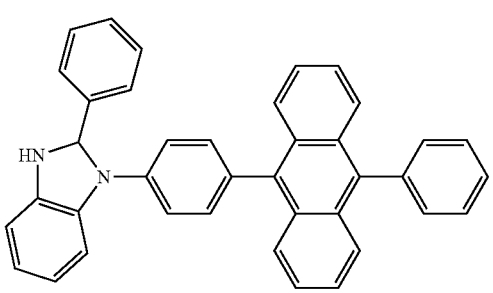 [SMILES: c1ccc(-c2c3ccccc3c(-c3ccc(N4c5ccccc5NC4c4ccccc4)cc3)c3ccccc23)cc1] | −6.10 | −2.70 | 2.2 |
| BH | 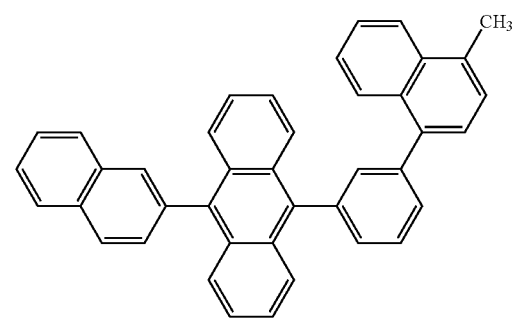 [SMILES: Cc1ccc(-c2cccc(-c3c4ccccc4c(-c4ccc5ccccc5c4)c4ccccc34)c2)c2ccccc12] | −6.00 | −2.99 | 1.85 |

| Name | Structure | HOMO (eV) | LUMO (eV) | T₁ (eV) |
|---|---|---|---|---|
| BD | 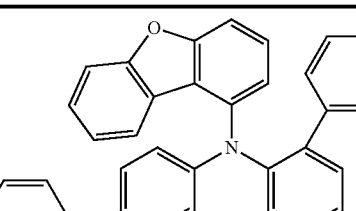 | −5.61 | −2.81 | — |

Experimental Example 1: Evaluation of Characteristics of Organic Light-Emitting Diode (Above)

Operation characteristics of the organic light-emitting diodes fabricated in Example 1 and Comparative Example 1 were evaluated. Table 1 shows voltage-current density, brightness-current efficiency, brightness-external quantum efficiency (EQE), and lifespan of the organic light-emitting diodes fabricated in Example 1 and Comparative Example 1.

TABLE 1

| Item | Voltage (V) | Voltage-current density (Cd/A) | Brightness-external quantum efficiency (EQE) | Lifespan (hours) |
|---|---|---|---|---|
| Example 1 | 3.7 | 8.0 | 8.1 | 50 |
| Comparative Example 1 | 4.4 | 6.3 | 6.5 | 25 |

The organic light-emitting diode of Comparative Example 1 did not satisfy Conditions (E), (I), and (J). As a result, the organic light-emitting diode of Comparative Example 1 had a larger HOMO energy gap between HTL2 and BH than the organic light-emitting diode of Example 1 and low T1 energy (triplet energy). With reference to Table 1, in the organic light-emitting diode of Comparative Example 1, the HTL2 material had a triplet energy $T_{1,HTL}$ of 2.52 eV (<2.8 eV). Further, in the organic light-emitting diode of Comparative Example 1, the ETL2 material had a triplet energy $T_{1,ETL}$ of 2.2 eV (<2.6 eV), which is higher than the triplet energy of the blue host material (satisfying the first half of Condition (J)), but is out of the triplet energy range defined in Condition (J) (not satisfying the latter half of Condition (J)). As in Comparative Example 1, in which the material had a lower triplet energy than $T_{1,HTL}$ and $T_{1,ETL}$ defined in Condition (J), the difference between the triplet energy of the blue host material of the blue light-emitting layer and the triplet energy of each of the hole transport layer material and the electron transport layer material becomes insignificant. With reference to FIG. 7, the organic light-emitting diode of Comparative Example 1 exhibited an insignificant difference in triplet energy between the blue host material and the hole transport layer material or the electron transport layer material, as compared with the organic light-emitting diode of Example 1. As such, Condition (J) means that the difference between the triplet energy of the blue host material and the triplet energy of each of the hole transport layer material and the electron transport layer material should be a certain level or more.

With reference to Table 1 and FIG. 6, in the organic light-emitting diode of Example 1, the hole transport layer material had a triplet energy of $T_{1,HTL}$=2.82 eV and the electron transport layer material had a triplet energy of $T_{1,ETL}$=2.67 eV, thereby satisfying the triplet energy ranges defined in Condition (J). The difference between the triplet energy of the blue host material and the triplet energy of each of the hole transport layer material and the electron transport layer material was a certain level or more.

The organic light-emitting diode of Comparative Example 1 did not satisfy Condition (E) (the difference between the HOMO energy levels was greater than 0.1 eV in Comparative Example 1), and thus required high driving voltage due to difficulty in injection of holes into the blue light-emitting layer. In addition, the organic light-emitting diode of Comparative Example 1 did not satisfy Conditions (I) and (J) (the difference between the LUMO energy levels was greater than 0.1 eV in Comparative Example 1, $T_{1,HTL}$=2.52 eV<2.8 eV, $T_{1,ETL}$=2.2 eV<2.6 eV), making it difficult for excitons generated in the blue light-emitting layer to remain therein. In Comparative Example 1, the excitons generated in the blue light-emitting layer can generate impurities through addition reaction with the charge transport layer around the blue light-emitting layer. The impurities act as traps with respect to charges injected into both sides of the blue light-emitting layer. As a result, the organic light-emitting diode can suffer deterioration in operation characteristics and lifespan. From Table 1, it could be seen that the organic light-emitting diode of Comparative Example 1 had poorer operation characteristics and a shorter lifespan than that of Example 1.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

LIST OF REFERENCE NUMERALS 100, 200, 300, 500: organic light-emitting diode
110, 210, 310, 410, 510: first electrode
120, 220, 320, 420, 520: second electrode
140, 240, 530: light-emitting stack
141, 241, 341, 351: hole transport layer
142, 242, 342, 352: blue light-emitting layer
144, 244, 344, 354: hole transport layer
243: hole injection layer
244: electron transport layer
245: electron injection layer
340: first light-emitting stack
350: second light-emitting stack
360: charge generation layer
362: N-type charge generation layer
364: P-type charge generation layer
400: organic light-emitting display

What is claimed is:

1. An organic light-emitting diode, comprising:
a first electrode;
a light-emitting stack on the first electrode comprising, sequentially stacked on the first electrode:
 a hole transport layer comprising a hole transport layer material;
 a blue light-emitting layer comprising:
  a blue host material; and
  a blue fluorescent dopant material; and
 an electron transport layer comprising an electron transport layer material; and
a second electrode on the light-emitting stack,
wherein the blue fluorescent dopant material has a higher LUMO (Lowest Unoccupied Molecular Orbital) energy level than the blue host material,
wherein the blue fluorescent dopant material has a higher HOMO (Highest Occupied Molecular Orbital) energy level than the blue host material,
wherein the blue fluorescent dopant material has a lower singlet energy than the blue host material,
wherein the hole transport layer material has a higher HOMO energy level than the blue host material,
wherein the hole transport layer material has a higher HOMO energy level than the blue fluorescent dopant material,
wherein a difference in HOMO energy level between the hole transport layer material and the blue fluorescent dopant material is 0.1 eV or less,
wherein the hole transport layer material has a higher LUMO energy level than the blue host material,
wherein a difference in LUMO energy level between the hole transport layer material and the blue host material is 0.5 eV or more,
wherein the hole transport layer material has a higher LUMO energy level than the blue fluorescent dopant material,
wherein the electron transport layer material has a higher LUMO energy level than the blue host material,
wherein the electron transport layer material has a higher LUMO energy level than the blue fluorescent dopant material,
wherein a difference in LUMO energy level between the electron transport layer material and the blue fluorescent dopant material is 0.1 eV or less, and
wherein the hole transport layer material, the electron transport layer material, and the blue host material have the following triplet energy relationships: $T_{1,BH} < T_{1,HTL}$ and $T_{1,BH} < T_{1,ETL}$, $2.8 < T_{1,HTL} < 3.0$, and $2.6 < T_{1,ETL} < 2.8$, where $T_{1,HTL}$, $T_{1,ETL}$ and $T_{1,BH}$ indicate triplet energies of the hole transport layer material, the electron transport layer material, and the blue host material, respectively.

2. The organic light-emitting diode of claim 1, wherein the hole transport layer material comprises a tertiary amine-based material.

3. The organic light-emitting diode of claim 1, wherein the blue host material comprises an anthracene-based material.

4. The organic light-emitting diode of claim 1, wherein the blue fluorescent dopant material comprises a pyrene amine derivative material.

5. The organic light-emitting diode of claim 1, wherein the electron transport layer material comprises a pyrimidine-based material.

6. The organic light-emitting diode of claim 1, wherein the blue light-emitting layer comprises 1 wt % to 5 wt % of the blue fluorescent dopant material.

7. The organic light-emitting diode of claim 1, wherein:
the light-emitting stack is a first light-emitting stack; and
at least one additional light-emitting stack, comprising a second light-emitting stack, is further between the first electrode and the second electrode.

8. The organic light-emitting diode of claim 7, further comprising a charge generation layer between the first light-emitting stack and the second light-emitting stack.

9. The organic light-emitting diode of claim 8, wherein the charge generation layer comprises:
an N-type charge generation layer; and
a P-type charge generation layer.

10. The organic light-emitting diode of claim 7, wherein the organic light-emitting diode comprises a white organic light-emitting diode comprising the at least one additional light-emitting stack configured to emit red (R), green (G), or yellow (Y) light.

11. An organic light-emitting display, comprising:
a substrate;
the organic light-emitting diode of claim 1 on the substrate; and
a driving device between the substrate and the organic light-emitting diode, and connected to the first electrode.

12. The organic light-emitting display of claim 11, further comprising a color filter disposed:
between the substrate and the first electrode; or
on the organic light-emitting diode.

13. A method of manufacturing an organic light-emitting diode, the method comprising:
providing a first electrode;
providing a light-emitting stack on the first electrode comprising, sequentially stacking on the first electrode:
 a hole transport layer comprising a hole transport layer material;
 a blue light-emitting layer comprising:
  a blue host material; and
  a blue fluorescent dopant material; and
 an electron transport layer comprising an electron transport layer material; and
providing a second electrode on the light-emitting stack, wherein the blue fluorescent dopant material has a higher LUMO (Lowest Unoccupied Molecular Orbital) energy level than the blue host material, wherein the blue fluorescent dopant material has a higher HOMO (Highest Occupied Molecular Orbital) energy level than the blue host material, wherein the blue fluorescent dopant material has a lower singlet energy than the blue host material, wherein the hole transport layer material has a higher HOMO energy level than the blue host material, wherein the hole transport layer material has a higher HOMO energy level than the blue fluorescent dopant material, wherein a difference in HOMO energy level between the hole transport layer material and the blue fluorescent dopant material is 0.1 eV or less, wherein the hole transport layer material has a higher LUMO energy level than the blue host material, wherein a difference in LUMO energy level between the hole transport layer material and the blue host material is 0.5 eV or more, wherein the hole transport layer material has a higher LUMO energy level than the blue fluorescent dopant material, wherein the electron transport layer material has a higher LUMO energy level than the blue host material, wherein the electron transport layer material has a higher LUMO energy level than the blue fluorescent dopant material, wherein a difference in LUMO energy level between the electron transport layer material and the blue fluorescent dopant material is 0.1 eV or less, and wherein the hole transport layer material, the electron transport layer material, and the blue host material have the following triplet energy relationships: $T_{1,BH} < T_{1,HTL}$ and $T_{1,BH} < T_{1,ETL}$, $2.8 < T_{1,HTL} < 3.0$, and $2.6 < T_{1,ETL} < 2.8$, where $T_{1,HTL}$, $T_{1,ETL}$ and $T_{1,BH}$ indicate triplet energies of the hole transport layer material, the electron transport layer material, and the blue host material, respectively.

14. The method of claim 13, wherein the providing the hole transport layer material comprises providing a tertiary amine-based material.

15. The method of claim 13, wherein the providing the blue host material comprises providing an anthracene-based material.

16. The method of claim 13, wherein the providing the blue fluorescent dopant material comprises providing a pyrene amine derivative material.

17. The method of claim 13, wherein the providing the electron transport layer material comprises providing a pyrimidine-based material.

18. The method of claim 13, wherein the blue light-emitting layer comprises 1 wt % to 5 wt % of the blue fluorescent dopant material.

19. The method of claim 13, wherein:
the providing the light-emitting stack comprises providing a first light-emitting stack; and
the at least one additional light-emitting stack, comprising a second light-emitting stack, is further provided between the first electrode and the second electrode.

20. The method of claim 19, further comprising providing a charge generation layer between the first light-emitting stack and the second light-emitting stack.

21. The method of claim 20, wherein the providing the charge generation layer comprises:
providing an N-type charge generation layer; and
providing a P-type charge generation layer.

22. The method of claim 19, wherein the providing the organic light-emitting diode comprises providing a white organic light-emitting diode comprising the at least one additional light-emitting stack configured to emit red (R), green (G), or yellow (Y) light.

* * * * *